(12) United States Patent
Bordel et al.

(10) Patent No.: US 8,039,370 B2
(45) Date of Patent: Oct. 18, 2011

(54) METHOD OF TRANSFERRING A LAYER ONTO A LIQUID MATERIAL

(75) Inventors: Damien Bordel, Grenoble (FR); Léa Di Cioccio, Saint Ismier (FR)

(73) Assignee: Commissariat a l'Energie Atomique, Paris (FR)

( * ) Notice: Subject to any disclaimer, the term of this patent is extended or adjusted under 35 U.S.C. 154(b) by 33 days.

(21) Appl. No.: 12/672,001

(22) PCT Filed: Aug. 5, 2008

(86) PCT No.: PCT/EP2008/060261
§ 371 (c)(1),
(2), (4) Date: Mar. 5, 2010

(87) PCT Pub. No.: WO2009/019265
PCT Pub. Date: Feb. 12, 2009

(65) Prior Publication Data
US 2011/0177676 A1      Jul. 21, 2011

(30) Foreign Application Priority Data
Aug. 7, 2007  (FR) .................................. 07 56983

(51) Int. Cl.
*H01L 21/36*  (2006.01)
*H01L 21/46*  (2006.01)

(52) U.S. Cl. ............ 438/478; 438/457; 257/E33.025; 257/E33.028; 257/E33.031

(58) Field of Classification Search .......... 438/455, 438/458, 478, 502, 509, 26, 47; 257/E21.567, 257/E21.568
See application file for complete search history.

(56) References Cited

U.S. PATENT DOCUMENTS

| 6,214,733 | B1 * | 4/2001 | Sickmiller | ............ 438/691 |
| 2003/0213950 | A1 * | 11/2003 | Hwang | ............ 257/18 |
| 2008/0271835 | A1 * | 11/2008 | Di Cioccio et al. | ............ 156/91 |

FOREIGN PATENT DOCUMENTS

EP     0 441 270 A2     8/1991

OTHER PUBLICATIONS

French Preliminary Search Report dated Mar. 10, 2009 (12 pgs).
Damiencourt, et al., "High'Quality Fully Relaxed $In_{0.65}Ga_{0.35}$ As Layers Grown on InP Using the Paramorphic Approach"—Applied Physics Letters—vol. 75, No. 23—Dec. 6, 1999, pp. 3638-3640.
Kostrzewa M. et al., "Feasibility of Strain Relaxed InAsP and InGaAs Compliant Substrates"—2003 IEEE, pp. 437-440.
Kostrzewa M. et al., "Feasibility of III-V On-Silicon Strain Relaxed Substrates"—Journal of Crystal Growth 275 (2005), pp. 157-166.

(Continued)

*Primary Examiner* — Julio J Maldonado
(74) *Attorney, Agent, or Firm* — Brinks Hofer Gilson & Lione

(57) ABSTRACT

A method for transferring a layer onto a support includes transferring the layer, assembled on an initial substrate, onto a liquid layer that has been previously deposited on the support. The layer is subsequently released from the initial substrate by chemical etching, and the liquid layer is evacuated to allow molecular adhesion of the layer to the support.

18 Claims, 3 Drawing Sheets

OTHER PUBLICATIONS

Lo, Y.H., "*New Approach to Grow Pseudomorphic Structure over the Critical Thickness*"—Jun. 27, 1991; accepted for publication Aug. 29, 1991, 3 pages.

Srinivasan et al., "*Microstructure of Substrate Self-Assembly Using Capillary Forces*"—Journal of Microelectromechanical Systems, vol. 10, No. 1, Mar., 2001, pp. 17-24.

Wu, Ye-Ee et al., "*Applying Liquid Protection Method to Solid-State Bonding Process of AA7075 Aluminum Alloys*"—Journal of Materials Processing Technology, (2003), pp. 700-704.

Yin, H. et al., "*Strain Relaxation of SiGe Islands on Compliant Oxide*"—Journal of Applied Physics, vol. 91, No. 12, Jun. 15, 2002, pp. 9716-9722.

\* cited by examiner

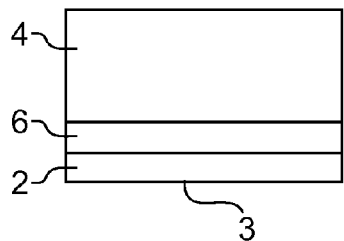
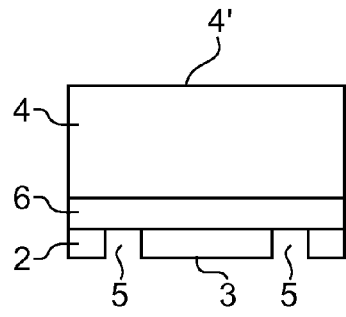
FIG.1A  FIG.1B
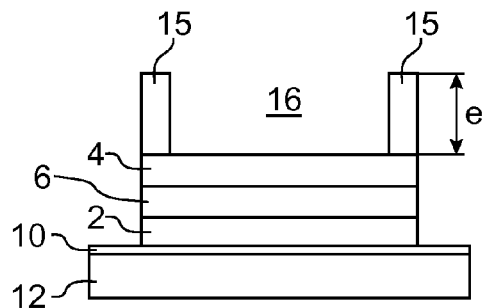
FIG.1C
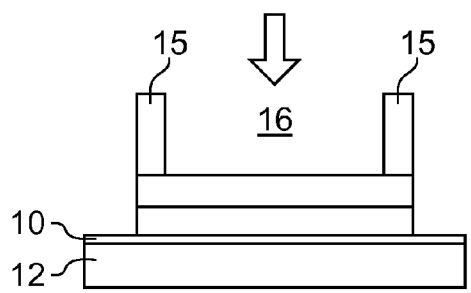
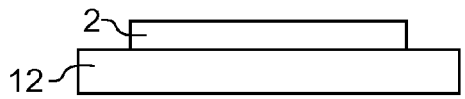
FIG.1D  FIG.1E

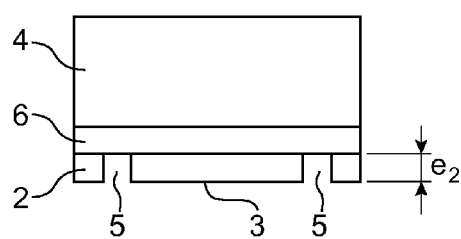
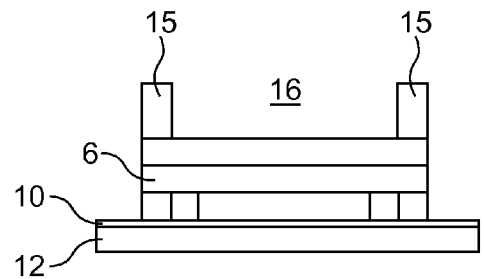
FIG.2A      FIG.2B
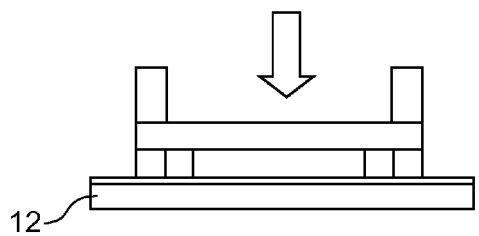
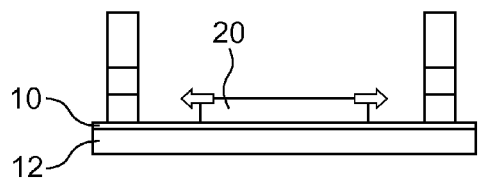
FIG.2C      FIG.2D
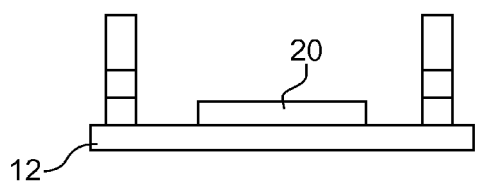
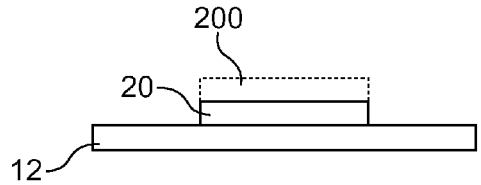
FIG.2E      FIG.2F

METHOD OF TRANSFERRING A LAYER ONTO A LIQUID MATERIAL

PRIORITY CLAIM

This application is a U.S. nationalization of PCT Application No. PCT/EP2008/060261, filed Aug. 5, 2008, and claims priority to French Patent Application No. 0756983, filed Aug. 7, 2007, the entire contents of which are hereby incorporated herein by reference.

TECHNICAL FIELD

The present invention relates generally, to methods for epitaxially growing thin films and, more particularly, to methods for preparing a surface layer for epitaxial growth.

BACKGROUND

Microelectronic and optoelectronic components are now made from combinations of monocrystalline materials manufactured using epitaxy techniques. Modern epitaxy techniques make it possible to prepare and combine materials of very high purity having properties close to their ideal theoretical performances.

However, a certain number of technological difficulties remain, hindering the full development of these techniques. Indeed, in the case of optoelectronic applications, semi-conductor alloys cover a very wide range of composition and thus of associated wavelengths and applications. However, the monocrystalline nature of the substrates and the use of epitaxy techniques lead to intrinsic restrictive limitations, since it will be possible á priori to only combine materials having identical or very similar lattice parameters. Indeed, as a function of the substrates available, only narrow ranges of composition may be exploited.

Attempts have been made to grow, by heteroepitaxy, alloys having a lattice mismatch on standard substrate. Said alloys are then strained. Beyond a thickness known as critical (of several nm), the strain energy causes the plastic relaxation of the epitaxied layer. This results in the appearance of extensive structural defects (low mismatch) or island growth (high mismatch). This mode of relaxation leads to a roughening of the surface and to a deterioration in the optical and electronical properties of the materials.

The document of Y. H. Lo et al., Appl. Phys. Lett. 59, 2311, 1991 proposes the formation of a lattice parameter mismatched layer. It involves a strained layer of thickness less than the critical plastic relaxation thickness, which is elastically relaxed to avoid generating defects. A resumption of lattice parameter matched epitaxy may then be carried out on this relaxed layer, over large thicknesses, without generating defects. This concept makes it possible to obtain layers of compositions different to the compositions used on standard substrate.

This approach consists in epitaxying a strained layer on a substrate, then relaxing said layer to allow a resumption of epitaxy without generating structural defects. The relaxation can take place before or during the resumption of epitaxy.

This relaxation may be obtained by different methods, such as the use of a viscous material or sub-etching.

This approach has been applied by Yin H. Yin et al., J. Appl. Phys. 91, 9716, 2002, with the use of a glass (BPSG), as well as by M. Kostrzewa et al., J. Cryst. Growth. 275, 157, 2005, with the use of a wax. In this technique, the structure is transferred onto a viscous material. The strained layer, once released from the substrate on which it has been epitaxied, relaxes thanks to the viscosity of the support substrate, generally by heating the viscous material in order to increase its viscosity.

However, in these techniques, the viscosity of the layer is not high enough to obtain good relaxation. In fact, this takes place through formation of surface undulations, which can have major drawbacks. As a function of the amplitude and the wavelength of the undulations, it can lead to a surface roughening of the epitaxial layer on account of the non-uniform deformation field that it generates on the surface of the material. Techniques employing transfer on viscous material are thus limited.

The sub-etching technique applied by Damlencourt et al., Appl. Phys. Lett., 75, 3638, 1999, consists in forming an almost free strained layer held by arms. The layer is released from its support by sub-etching of a stop layer. The layer is then free to relax before it comes to bond on the initial substrate. However, being held by arms limits the relaxation and the selectivity of the strained layer with respect to the stop layer and limits the dimension of the relaxed membranes.

It is thus necessary to develop a novel technique enabling the relaxation of layers, particularly of large dimensions, without the above mentioned limitations.

SUMMARY

A method according to the invention comprises:

a transfer of a layer, supported by an initial substrate, onto a liquid layer previously deposited on a support, for example a layer of water, a release of said layer from the initial substrate and, an evacuation of the liquid layer to allow the molecular adhesion of the layer with the support.

The invention employs the use of a support with an intermediate liquid layer, preferably of low viscosity, between this support and the layer to be transferred. Said liquid layer is finally evacuated, which leads to a molecular adhesion to the support, after elimination of the initial substrate, for example by localised chemical thinning or localised chemical attack.

The localisation of the chemical attack may be obtained by means of a cavity, formed previously in the initial substrate, on the side opposite to the side of said substrate assembled with the layer to be transferred. Said cavity may be delimited by one or more wall(s) or one or more partition(s) formed in the initial substrate.

When the layer to be transferred is a strained layer, the release step makes it possible to relax the strains in said layer, the thickness of which may be less than or greater than its critical thickness.

According to yet another example, the layer to be transferred may have a curvature, which the release step makes it possible to flatten.

The layer to be transferred may be a layer epitaxied or bonded onto the initial substrate or onto a stop layer formed on said initial substrate.

The layer to be transferred may be etched in order to release its circumference from the centre. This layer may also be rendered hydrophilic, with a view to its assembly by molecular adhesion.

The support on which the layer is transferred may itself be deformed.

The invention also relates to a method for epitaxying a second layer of material on a first layer, comprising:

the transfer of said first layer, assembled on an initial substrate, onto a support, according to a transfer method according to the invention, then the epitaxial growth of the second layer on the first.

BRIEF DESCRIPTION OF DRAWINGS

FIGS. 1A to 1E illustrate an embodiment of a method according to the invention.

FIGS. 2A to 2F illustrate another embodiment of a method according to the invention.

DETAILED DESCRIPTION OF SPECIFIC EMBODIMENTS

Figure 3:
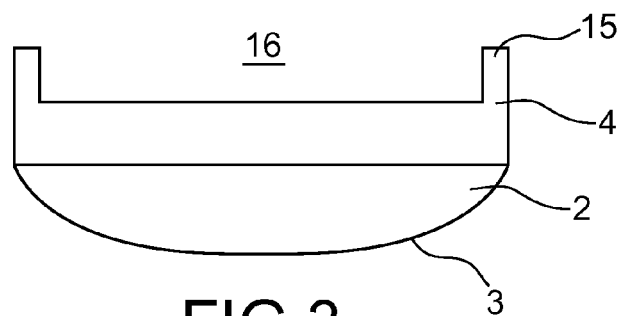
FIGS. 3 to 5 illustrate other configurations for which a method according to the invention is applicable.

An embodiment of the invention will firstly be described with reference to FIGS. 1A-1E.

FIG. 1A represents a substrate, known as initial substrate 4, on which a layer 2 is formed or deposited or bonded. This layer 2 is for example an epitaxied layer.

Advantageously, the layer 2 is etched in order to release its circumference from the centre (FIG. 1B). The etching zones are designated by the reference 5. These zones are not shown in FIGS. 1C-1E, but the embodiment with etching zones 5 is deduced from these figures and the explanations below.

Between this layer 2 and the initial substrate may be deposited or formed a stop layer 6, which will help to control the future release of the layer 2. This layer 6 forms stop layer with a view to a chemical etching of the material 4; a certain selectivity, preferably at least equal to 10, is desirable between these two materials (the selectivity being the ratio between the rates of chemical etching of the material of layer 4 and the material of layer 6). Preferably a certain selectivity, for example also at least equal to 10, is also desirable between the layer 6 and the layer 2, with a view to the operation of removal of the layer 6.

The surface 3 of the layer 2 is preferably hydrophilic or rendered hydrophilic, for example by chemical or polishing treatment or addition of oxide or nitride type layer, with a view to the molecular bonding that it is wished to obtain on the final support 12 (FIG. 1E). The same is true of the surface of said support.

The layer 2, with the initial substrate 4, is deposited in contact with a layer of liquid material 10, which itself lies on the substrate 12 (FIG. 10). The thickness of this liquid layer may be chosen so that the only adhesion forces between the liquid 10 and the layer 2 are capillarity forces. This thickness is substantially that which enables Van der Waals bonds to be no longer involved in linking the layer 2 to the substrate 12 (unlike hydrophilic molecular bonding). This thickness is for example around 10 nm. Preferably, during this step, the layer 2 does not have any direct contact with the support 12.

It is then aimed to release the layer 2 from the initial substrate 4. Advantageously, this release is obtained by chemical etching of the latter. So as not to perturb, by the chemical etching, the layer 10 of liquid material or, more generally, the environment around the layer 2 and its substrate 4, for example neighbouring components or a neighbouring structure, patterns or walls 15, which delimit a cavity 16, may have been formed previously in the initial substrate 4, in order to enable a localised chemical attack on the whole of the substrate 4 and the layer 6, with the exception of the periphery (FIG. 1C).

These patterns 15, in the initial substrate 4, may be obtained by mechanically thinning it in its centre 4' over part of its thickness (FIG. 1C), thereby forming the cavity 16.

The substrate 4 may also be partially eliminated before the layer 2 is placed in contact with the liquid 10; then, the actual release step takes place, by chemical etching, after placing the layer 2 in contact with the liquid 10. The remainder of the initial substrate 4, and if necessary the stop layer 6, is thus chemically etched, for example by confining the chemical solution within the cavity 16 (FIG. 1D).

The liquid layer 10 is advantageously a layer containing molecules of water, the molecular bonding is then obtained in a natural manner after evacuation of said liquid layer, between the support 12 and the layer 2. The molecular bonding is then a hydrophilic type bonding.

The evacuation of the liquid layer placed between the layer 2 and the support 12 is obtained advantageously by evaporation of said liquid, for example under vacuum, or by heating, or instead by pumping (FIG. 1E).

The removal of the liquid layer enables the layer 2 to be laid flat on the support 12 by means of capillarity forces. If the support 12 is deformed, and has a curvature, said forces make it possible to place in contact the layer 2 with said deformed support. It will be seen later that it is also possible to place in contact a layer 2, the surface of which is deformed and has a curvature, with a flat support 12.

The patterns or residual walls 15 of the initial substrate and the strained layer may then be eliminated mechanically or chemically (FIG. 1E). The layer 2 then remains, assembled by molecular adhesion with its final support 12.

According to the technique described above, the layer 2, initially borne by the initial substrate 4, and if necessary by a stop layer 6, is brought onto the liquid layer 10 formed on the support 12. The layer 2 is then in floating state on the liquid layer 10, without any direct physical contact with the support 12. The initial substrate may then be thinned (FIGS. 1C and 1D). After elimination of the liquid layer 10, for example by one of the techniques already mentioned above, the layer 2 is in molecular adhesion state with the support 12 (FIG. 1E).

Another example of embodiment of the invention will now be described for the case of a strained layer 2, for example a layer epitaxied onto an initial substrate 4 of lattice parameter different to that of the epitaxied material. Thus, the invention may be applied to any material that cannot grow through homoepitaxy without being in a strained state. But, as already explained above with reference to FIGS. 1A-1E, the invention applies to any type of layer, thus also to the case of layers that are not in a strained state.

In this example (FIG. 2A), the thickness e2 of the strained layer 2 may be less than its critical thickness (thickness from which the strain is going to be eliminated progressively by plastic deformation), it may also be greater than said critical thickness.

As already explained above with reference to FIG. 1B, advantageously, the layer 2 is etched in order to release its circumference from the centre (FIGS. 2B and 2C). The etching areas are designated by the reference 5. This etching allows the release of the area to be relaxed of the layer 2 compared to the edges. The references 15 and 16 have the same signification as in the preceding figures.

Once again, a stop layer 6 plays the same role as in the preceding example, with, preferably, a certain selectivity, preferably at least equal to 10, between the two materials of the layer 4 and the layer 6, for the chemical etching.

The surface 3 of the layer 2 is preferably hydrophilic or rendered hydrophilic, with a view to the molecular bonding that it is wished to obtain on the final support 12 (FIG. 2F). The same is true of the surface of the latter.

The layer 2 epitaxied on the initial substrate is deposited on the liquid material 10 (FIG. 2B). It is then in contact with the liquid layer. The thickness of this liquid layer is such that the only adhesion forces between the liquid 10 and the layer 2 are capillarity forces. In other words, the layer 2 does not have, during this step, any direct contact with the support 12. Reference will be made to the indications already given above as regards the thickness of the liquid layer.

The strained layer 2 is then free to relax on the liquid material (FIG. 2D), the latter being confined between said strained layer and the support 12. A complete relaxation is attained when there is a disappearance of the undulations. To ensure this, the liquid layer preferably has a low viscosity. In other words, the viscous layer does not hinder the relaxation by slipping of the layer 2. The viscosity to choose depends on the nature of the material of the layer 2, its initial strain and the size of the samples to be relaxed.

The support of the strained layer 2 is ensured by capillarity forces that prevent it deforming in the vertical plane, through a winding effect.

The strained layer then becomes the relaxed layer 20.

The evacuation of the liquid layer 10, placed between the relaxed layer 20 and the support 12, is obtained by one of the techniques already mentioned above with reference to FIGS. 1D and 1E.

The removal of the liquid layer enables the relaxed layer 20 to be laid flat on the support 12 by means of capillarity forces. Here again, said forces can make it possible to place the relaxed layer 20 in contact with a deformed support 12, having a curvature. Advantageously, it is possible to press on it so as to expel the water and force the bonding after the bonding to the support 12.

After evacuation of the liquid layer, a molecular bonding is obtained between the relaxed layer 20 and the support 12 (FIG. 2F).

The liquid layer 10 is advantageously a layer containing molecules of water, the molecular bonding is then obtained in a natural manner after evacuation of said liquid layer, between the support 12 and the relaxed layer 20. The molecular bonding is then a hydrophilic type bonding. The residual walls 15 of the initial substrate and the strained layer are then eliminated mechanically or chemically (FIG. 2F).

A relaxed layer 20 transferred advantageously onto a support 12, for example of semi-conductor type (made of silicon, or InP, etc.) or other is thereby obtained.

The invention also applies to the case of a layer 2 to be transferred, the surface of which, to be placed in contact with the transfer substrate, has a certain curvature.

Figure 4:
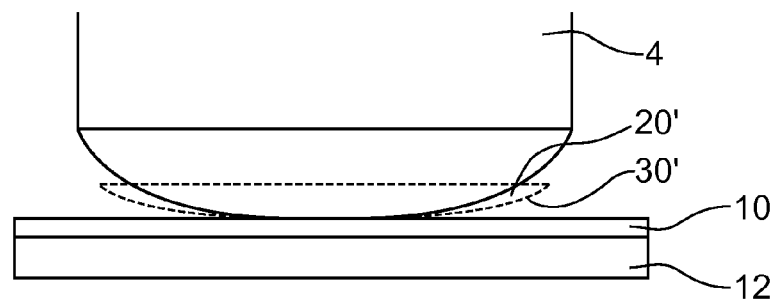
Figure 5:
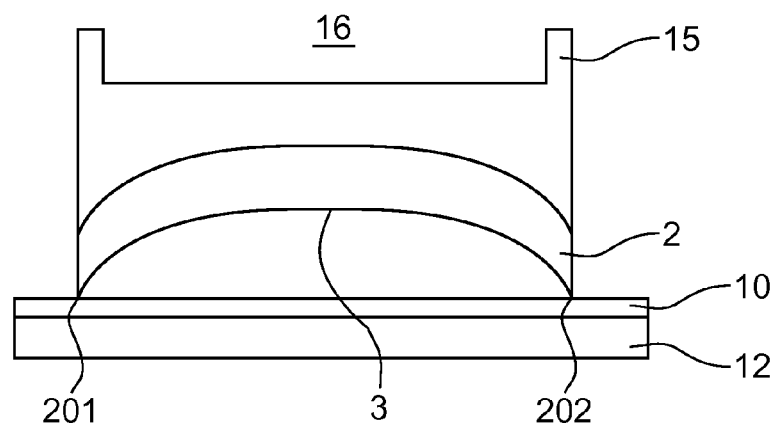

For example, both FIGS. 3 and 5 represent a substrate or a layer 2, the surface 3 of which is curved (FIGS. 3 and 4: surface 3 with convex curve; FIG. 5: surface 3 with concave curve), and which may thus not be bonded directly onto a substrate with flat surface such as the substrate 12 of FIGS. 1C and 2B. The curvatures indicated in these figures are exaggerated for reasons of clarity. This layer 2 is, as in the preceding examples, assembled or bonded with an initial substrate 4, it can also result from an epitaxy on this substrate, with if necessary strains as explained above with reference to FIGS. 2A-2F. In the substrate 4 of FIGS. 3-5, a cavity 16 has been etched, with patterns 15 around it, for the same reasons as previously. As in the preceding figures, there may be a stop layer 6 (with the same functions and properties as those indicated previously) between the layer 2 and the substrate 4, although it is not represented in FIG. 3 and zones 5 may be etched in the layer 2.

The layer 2 is positioned in contact with a liquid layer 10 on the support 12 (FIG. 4). A thinning may then be carried out, firstly of the substrate 4, then if necessary of the layer 2, as explained with reference to the preceding examples, during which the surface 30 is going to progressively flatten and come closer to the surface of the liquid 10, and the strains, if any, of the layer 2 are going to relax. Thus, the intermediate situation of the thinned substrate, designated by the reference 20', and its surface 30', less curved than the initial surface 30, are represented in FIG. 4, in interrupted lines.

When the thinning is continued, the surface 3 of the layer 2 is completely or almost completely in contact with the liquid layer 10. As already explained above, this is then evacuated and the two hydrophilic surfaces (surface 3 and surface of the support 12) are assembled by bonding by molecular adhesion.

In the case of FIG. 5, the layer or the substrate 2 has a curvature of its surface 30, reversed compared to the curvature of the surface 3 of the substrate 2 of FIG. 3.

The positioning of the substrate 2 on the liquid layer 10 makes it possible to prevent the bonding or the adhesion of the end points 201, 202 directly on the substrate 12; such a direct adhesion would prevent any relaxation of the layer 2. By progressively thinning said layer, the surface 3 will progressively come into contact, completely or almost completely, with the liquid layer 10, said contact here again being ensured by capillarity forces. Then the layer 10 is evacuated and the two hydrophilic surfaces are assembled by bonding by molecular adhesion.

In all of the examples given above, the material of the layer 2 is for example a semi-conductor material, particularly of III-V type. An example of such a material is GaN.

In the cases described above, a resumption of epitaxy may then be carried out on the layer 2. In other words, it is possible to carry out, after transfer of the first layer 2 or 20 onto a support 12, according to one of the techniques described above, the epitaxial growth of a second layer of material on this first layer. Thus, the layer 200 of FIG. 2F is formed by epitaxial growth on the layer 20. In fact, this resumption of epitaxy is more or less easy depending on the difference in the thermal expansion coefficients of the materials.

According to one example of application, the strained layer 2 is composed of $In_{0.65}Ge_{0.35}As$ strained to 0.8%. This layer is epitaxied by MBE (molecular beam epitaxy) on an InP substrate 4 via $In_{0.53}Ga_{0.47}As$ and InP stop layers 6. Patterns 5 are formed in the strained layer by photolithography.

The top of the substrate 4 is, in its turn, chemically thinned by means of an $HCl:H_2O$ (3:1) solution while protecting the edges 15 by resin, so that they are not attacked by the etching solution. The strained layer 2 is rendered hydrophilic by exposure to UV under $O_3$ for 10 minutes.

The host substrate 12 is a substrate of Si, or other; if necessary, a superficial layer of $SiO_2$, of around 400 nm thickness, covers the substrate 12. The latter is rendered hydrophilic by an exposure to $O_2$ plasma.

A thin film of water 10 is then deposited by wiping a damp cloth on the substrate 12.

The structure is deposited on the silicon substrate. The layers 4, 6 of InP and of InGaAs are etched respectively by means of $HCl:H_2O$ (3:1) and $H_2SO_4:H_2O_2:H_2O$ (1:1:10) solutions. The strained layer 20 is then free to relax elastically on the film 10 of water.

The latter is then evaporated by leaving the structure in ambient air, enabling the relaxed layer 20 to come into contact with the silicon substrate 12, the surface of which has previously been rendered hydrophilic. The bonding takes place by molecular bonding. A bonding reinforcement annealing is carried out at 200° C. for 2 h.

The edges of the structure are removed chemically with the solutions described previously.

A resumption of epitaxy may then be carried out on the layer 2.

According to another example of application, the invention has been implemented with success on chips of 5 mm by 5 mm and 10 mm by 3 mm with a volume of water 10 between 0.2 and 0.7 microliters. Such a volume of water moreover enables the chip to position itself on the substrate 12 before its bonding.

As explained above with reference to FIGS. 1A-1E, the invention does not only apply to a strained layer 2. It can apply as technique for transferring any layer.

The invention claimed is:

1. A method for transferring a layer onto a support, the method comprising:
    transferring the layer, assembled on an initial substrate, onto a liquid layer previously deposited on the support, where a thickness of the liquid layer is such that adhesion forces between the liquid of the liquid layer and the layer are capillarity forces and the layer is in a floating state on the liquid layer,
    releasing the layer from the initial substrate by chemical attack, and
    evacuating the liquid layer to allow molecular adhesion of the layer to the support.

2. The method according to claim 1, wherein the layer to be transferred comprises a strained layer, and releasing the layer enables relaxation of strains in the layer.

3. The method according to claim 2, wherein a thickness of the strained layer is less than its critical thickness.

4. The method according to claim 1, wherein a free surface of the layer has a curvature, and wherein releasing the layer makes it possible to flatten the curvature.

5. The method according to claim 1, wherein the layer comprises a layer epitaxied or bonded onto the initial substrate.

6. The method according to claim 1, further comprising forming a stop layer on the initial substrate, wherein the layer is assembled with the initial substrate through the intermediary of the stop layer.

7. The method according to claim 1, further comprising etching the layer in order to release its circumference from a centre.

8. The method according to claim 1, further comprising rendering the layer hydrophilic, before transferring the layer onto the liquid layer.

9. The method according to claim 1, wherein releasing the layer from the initial substrate comprises chemical etching of the initial substrate.

10. The method according to claim 1, further comprising forming a cavity in the initial substrate on a side opposite to a side of the initial substrate assembled with the layer to allow a localized chemical attack on the whole of the initial substrate, with the exception of its periphery.

11. The method according to claim 10 further comprising chemically etching the initial substrate by confining a chemical solution within the cavity.

12. The method according to claim 1, wherein evacuating the liquid layer comprises evaporation of the liquid layer or pumping the liquid layer.

13. The method according to claim 1, wherein the support comprises a deformed support.

14. The method according to claim 1, wherein the liquid layer comprises a layer of water.

15. The method according to claim 1, wherein the layer comprises a semiconductor material.

16. A method for epitaxying a second layer of material on a first layer, the method comprising:
    transferring the first layer, assembled on an initial substrate onto a support according to the transfer method of claim 1, and
    epitaxially growning the second layer on the first layer.

17. The method of claim 14, wherein the semiconductor material comprises a III-V type semiconductor.

18. The method of claim 14, wherein the semiconductor material comprises GaN.

* * * * *